(12) United States Patent
Lipson et al.

(10) Patent No.: US 8,050,308 B2
(45) Date of Patent: Nov. 1, 2011

(54) TRANSMITTER OPTICAL SUBASSEMBLY WITH VOLUME PHASE HOLOGRAPHIC OPTICS

(75) Inventors: Jan Lipson, Cupertino, CA (US); Zheng Wang, San Jose, CA (US); Mina Farr, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 726 days.

(21) Appl. No.: 10/351,620

(22) Filed: Jan. 23, 2003

(65) Prior Publication Data

US 2003/0156607 A1 Aug. 21, 2003

Related U.S. Application Data

(60) Provisional application No. 60/357,074, filed on Feb. 12, 2002.

(51) Int. Cl.
*H01S 3/08* (2006.01)
(52) U.S. Cl. ........ 372/108; 372/101; 372/102; 372/50.1; 372/50.23; 359/16
(58) Field of Classification Search .............. 372/108, 372/101, 102, 50.1, 50.03, 29.023; 359/16
See application file for complete search history.

(56) References Cited

U.S. PATENT DOCUMENTS

| | | | | |
|---|---|---|---|---|
| 4,286,838 A | * | 9/1981 | Huignard et al. | ............ 372/50.1 |
| 4,768,846 A | * | 9/1988 | Connors et al. | .................... 359/3 |
| 4,878,718 A | * | 11/1989 | Gilbreath-Frandsen et al. | ................................ 359/12 |
| 5,070,509 A | * | 12/1991 | Meyers | ....................... 372/45.01 |
| 5,815,293 A | * | 9/1998 | Komma et al. | .................. 359/19 |
| 6,418,251 B1 | * | 7/2002 | Boscha | ........................... 385/31 |
| 6,707,072 B2 | * | 3/2004 | Ohkubo et al. | .................. 257/98 |

OTHER PUBLICATIONS

Ward et al. ("Lens aberration correction by holography", Applied Optics, vol. 10, No. 4, Apr. 1971.*
Hariharan, P.; "Optical holography: Principles, techniques and applications" @ Cambridge University Press 1984 (pp. 42-45).
Wyrowski, Frank and Bryngdahl, Olof, "Digital holography as part of diffractive optics" [review received Feb. 1991]; Physics Department, University of Essen, 4300 Essen 1, Federal Republic of Germany; (pp. 1481-1571).
Logue, James and Chisholm, Marilynn L.; "General approaches to mask design for binary optics"; SPIE vol. 1052 Holographic Optics: Optically and Computer Generated (1989); (pp. 19-24).

* cited by examiner

*Primary Examiner* — Tod T Van Roy
(74) *Attorney, Agent, or Firm* — Maschoff Gilmore & Israelsen (57) ABSTRACT

A means for optically coupling a semiconductor laser to an optical fiber is disclosed. In one embodiment, a volume phase holographic element is disposed on a light-emitting surface of a semiconductor laser. The volume phase holographic element acts as an aberration-corrector for a lens that is disposed between the semiconductor laser and the optical fiber. In this way, an inexpensive lens that is not aberration free can be used. In some embodiments, the volume phase holographic element converts a Gaussian light beam emitted by the semiconductor laser into an annular beam that is more suitable for long distance transmission in multimode fibers.

14 Claims, 7 Drawing Sheets

TRANSMITTER OPTICAL SUBASSEMBLY WITH VOLUME PHASE HOLOGRAPHIC OPTICS

The present application claims priority to, under 35 U.S.C. 119(e), U.S. Provisional Patent Application bearing Ser. No. 60/357,074, filed Feb. 12, 2002, which is incorporated herein by reference.

BRIEF DESCRIPTION OF THE INVENTION

The present invention relates generally to optoelectronic devices. More particularly, the present invention relates to using volume phase holographic optics in an optoelectronic device.

BACKGROUND OF THE INVENTION

A transmitter optical subassembly (TOSA) is an important component of an optoelectronic transmitter or transceiver. A typical TOSA includes a semiconductor laser, a lens and a receptacle into which an optical fiber can be inserted easily. The lens, which is for converging light beams to the end of the optical fiber, generally needs to be a small aberration-free lens with high numerical aperture. Small aberration-free lenses with high numerical aperture are difficult to fabricate and costly. Sometimes, they have to be made of sapphire and constitute a significant portion of the manufacturing cost of optoelectronic transmitters and tranceivers.

In a typical optoelectronic transmitter or transceiver, the semiconductor laser emits light beams that have a substantially Gaussian intensity distribution, sometimes called a Gaussian profile. Such light beams, however, suffer significant intermodal dispersion. Thus, they cannot be transmitted for very long distances in multimode fibers.

Accordingly, there exists a need for an inexpensive means for optically coupling a semiconductor laser to an optical fiber. There also exists a need for a means for optically coupling a semiconductor laser to a multimode optical fiber.

SUMMARY OF THE INVENTION

The present invention provides a means for optically coupling a semiconductor laser to an optical fiber. According to one embodiment of the invention, a layer of photo-sensitive emulsion is disposed onto a light-emitting surface of the semiconductor laser. Then, hologram developing processes are applied to the emulsion to create a volume phase holographic element. When the semiconductor laser is placed within a transmitter optical subassembly (TOSA), which includes a lens for converging emitted light beams to an end of an optical fiber, the volume phase holographic element compensates for aberration of the lens. Because the volume phase holographic element can reduce the aberration, the lens itself does not have to be aberration-free. Thus, inexpensive non-aberration free lenses can be used in TOSAs.

In one embodiment, the volume phase holographic element is formed by exposing the photo-sensitive emulsion (disposed on a light-emitting surface of the semiconductor laser) to two or more interfering light beams. In another embodiment, the semiconductor laser is used as a light source itself, and the light beams that it emits are used to form an interference pattern in the emulsion. In yet another embodiment, the emulsion is illuminated by a laser through a phase mask. After interference patterns are formed in the emulsion, various hologram developing processes including both wet and dry processes can be used to form a volume phase hologram in the emulsion.

In one embodiment, volume phase holograms are formed in situ within a TOSA. That is, a TOSA containing a semiconductor laser, a lens and an optical fiber is first assembled. Then, the volume phase holograms are formed within the assembled TOSA. In particular, the semiconductor laser is used as a light source, and light emitted by the semiconductor laser and a reflected version of the emitted light together form the interference patterns in the emulsion. In another embodiment, volume phase holograms are formed in situ within a TOSA that does not have a lens for converging the emitted light onto the optical fiber.

In yet another embodiment, the volume phase hologram converts a Gaussian light beam emitted by the semiconductor laser into an annular beam. The annular beam is suitable for multimode fiber because this class of beams suffers less intermodal dispersion.

BRIEF DESCRIPTION OF THE DRAWINGS

Aspects of the present invention will be more readily apparent from the following description and appended claims when taken in conjunction with the accompanying drawings, in which:

DESCRIPTION OF PREFERRED EMBODIMENTS

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
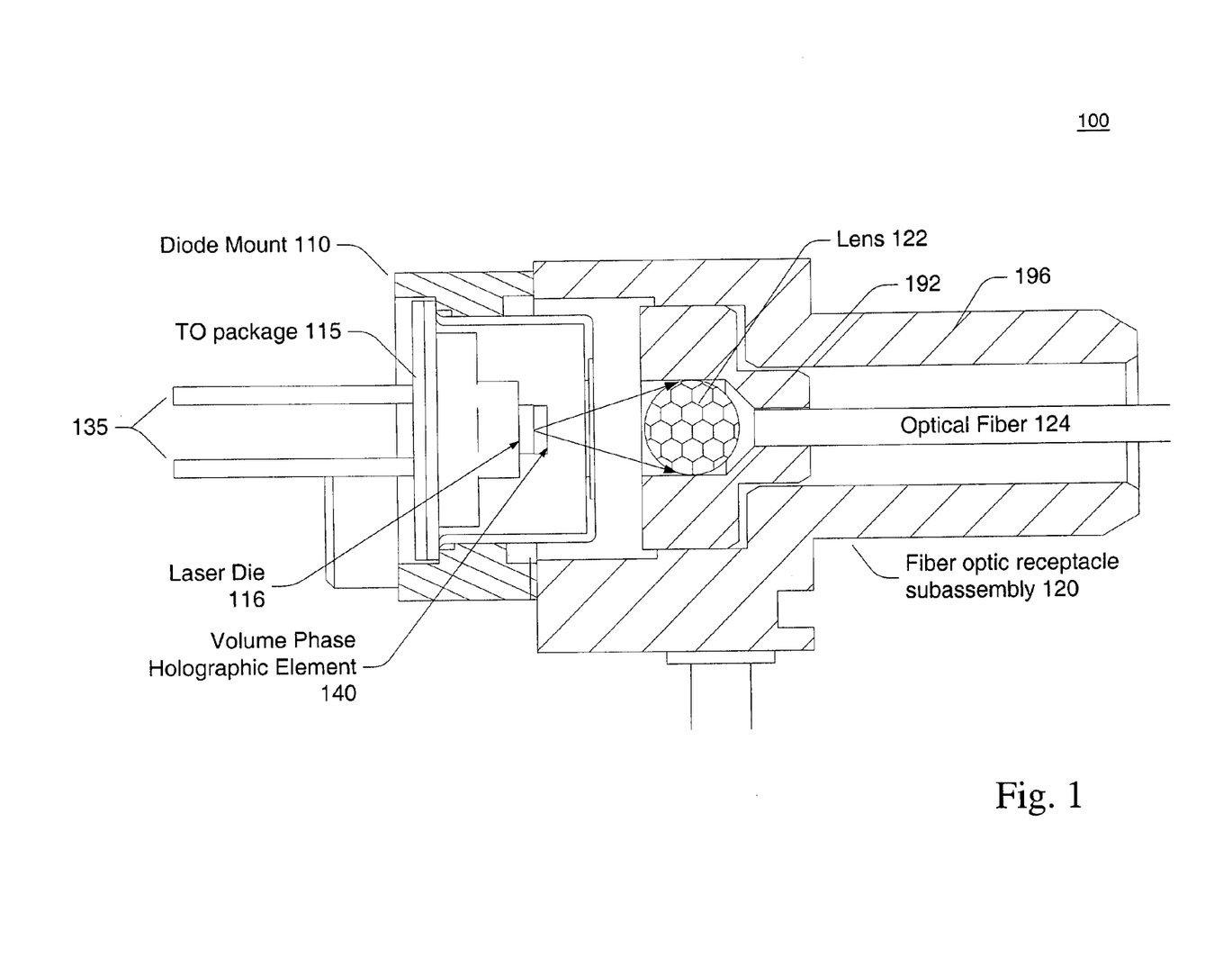
FIG. 1 depicts a cross-sectional view of a Transmitter Optical SubAssembly (TOSA) according to an embodiment of the invention.

In furtherance of an embodiment of the present invention, FIG. 1 depicts a cross-sectional view of a Transmitter Optical SubAssembly (TOSA) 100, which may be part of a optoelectronic transmitter or transceiver. As shown, the TOSA 100 includes a diode mount structure 110 and an optical fiber receptacle structure 120. Mounted on the diode mount structure 110 is a transistor outline (TO) laser package 115, which has a semiconductor laser 116 (e.g., an edge emitter, or a Vertical Cavity Surface Emitting Laser (VCSEL)) and a window aligned between the semiconductor laser 116 and the optical fiber receptacle structure 120. The optical fiber receptacle structure 120 includes a fiber aligning sleeve 196 and a fiber stop 192 for receiving and aligning an optical fiber 124 with the laser package 115. In the embodiment illustrated in FIG. 1, the optical fiber receptacle structure 120 includes a lens 122 that focuses light emitted from the laser package 115 onto an end of the optical fiber 124.

With reference still to FIG. 1, the lens 122 is not an aberration-free lens. Aberration of the lens 122 is compensated or reduced by a volume phase holographic element 140 that is disposed on a light-emitting surface of the laser diode 116. In particular, the volume phase holographic element 140 is a layer of material with volume phase holograms formed therein that redirects light wavefronts emerging from the laser 116. By redirecting the light in much the same way as would a correcting lens, aberrations in the lens 122 are at least partially compensated.

Figure 5:
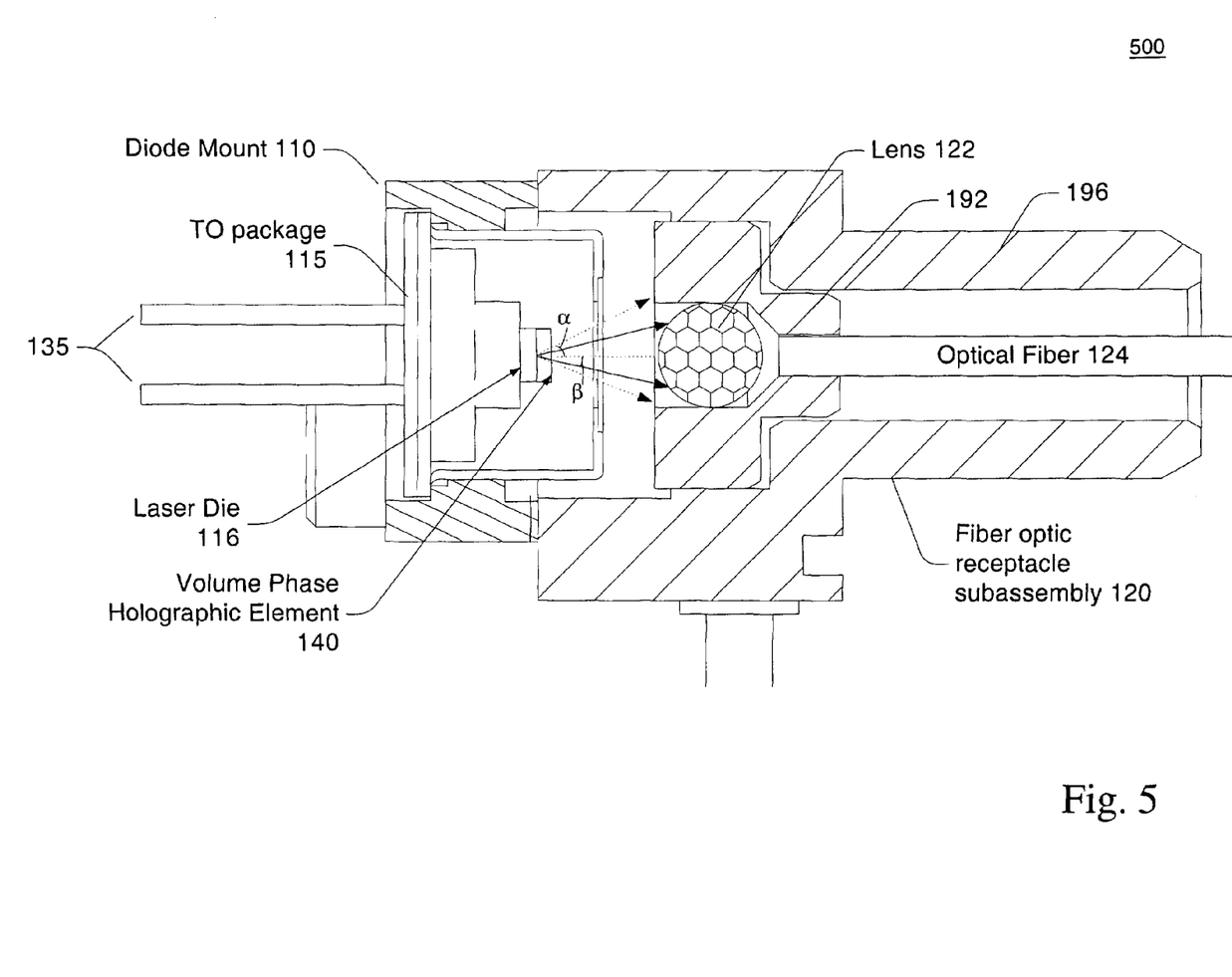
FIG. 5 depicts a cross sectional view of a TOSA according to another embodiment of the present invention.

In another embodiment, the volume phase holographic element has volume phase holograms formed therein that reduce the vertex angle of the largest cone of meridional rays emitted by the semiconductor laser 116. In FIG. 5, which depicts a cross section of a TOSA 500, the vertex angle of largest cone of meridional rays emitted by the semiconductor laser 116 without the volume phase holographic element 540 is denoted as α, and the vertex angle of the largest cone of meridional rays emitted with the volume phase holographic element 540 present is denoted as β. In other words, the volume phase holographic element 540 acts as a lens that limits the vertex angle of the emitted light. This will also reduce the aberration of the lens. An additional benefit of reducing the vertex angle of the emitted light is that a lens with a lower numerical aperture can be used.

Attention now turns to processes for fabricating the volume phase holographic elements. In one embodiment, volume phase holographic elements are formed on a wafer of semiconductor laser diodes. Specifically, photo-sensitive emulsions are disposed on the wafer (e.g., deposited and then distributed by spinning the wafer) of semiconductor lasers. The emulsions are then exposed to a laser interference pattern. The emulsions are subsequently developed using a suitable one of the many well known hologram developing processes.

Some photo-sensitive emulsions suitable for purposes the present invention include, but are not limited to, the following materials:

Dichromated gelatin;
Photopolymers, which are compositions based on polymers/oligomers/monomers that can be selectively polymerized and/or crosslinked upon selective exposure by light radiation;
Lithium Niobate ($LiNdO_3$); and
Glass doped with Germanium.

Figure 2:
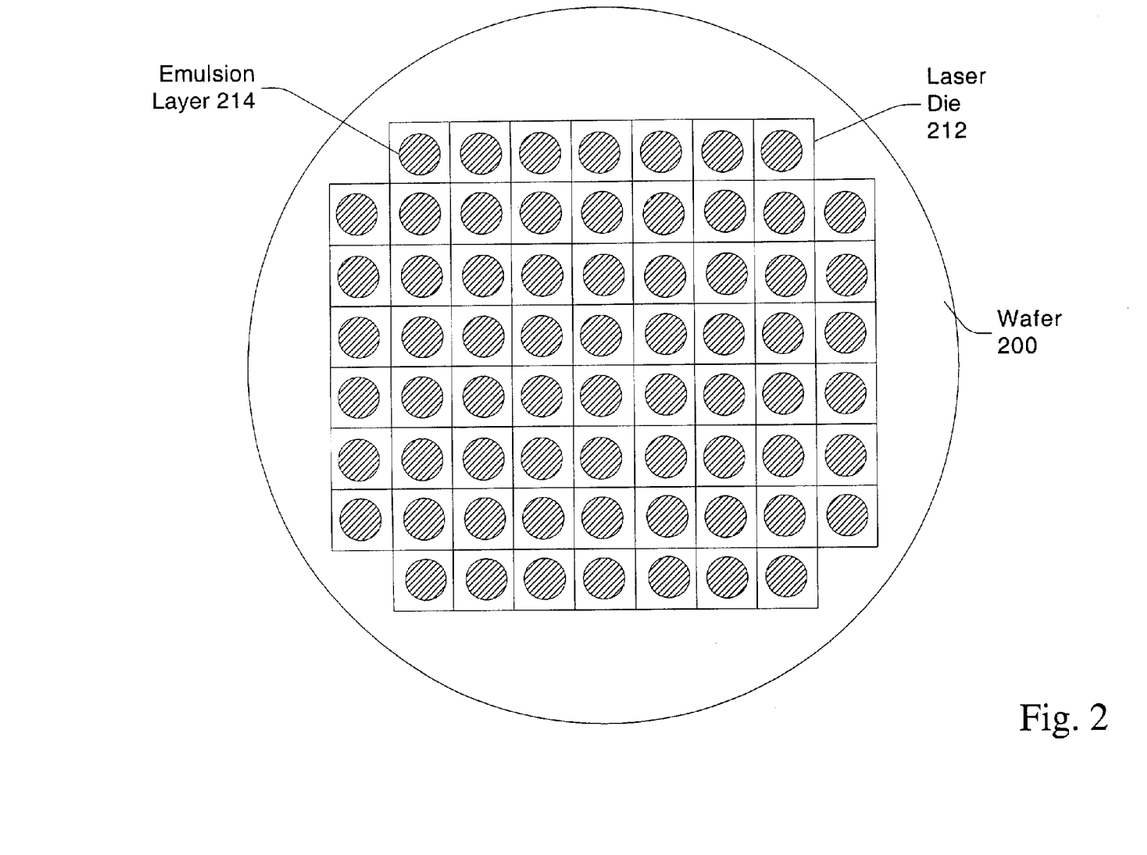
FIG. 2 depicts a top view of a semiconductor wafer with a layer of photo-sensitive emulsion disposed thereon in accordance with an embodiment of the present invention.
Figure 3:
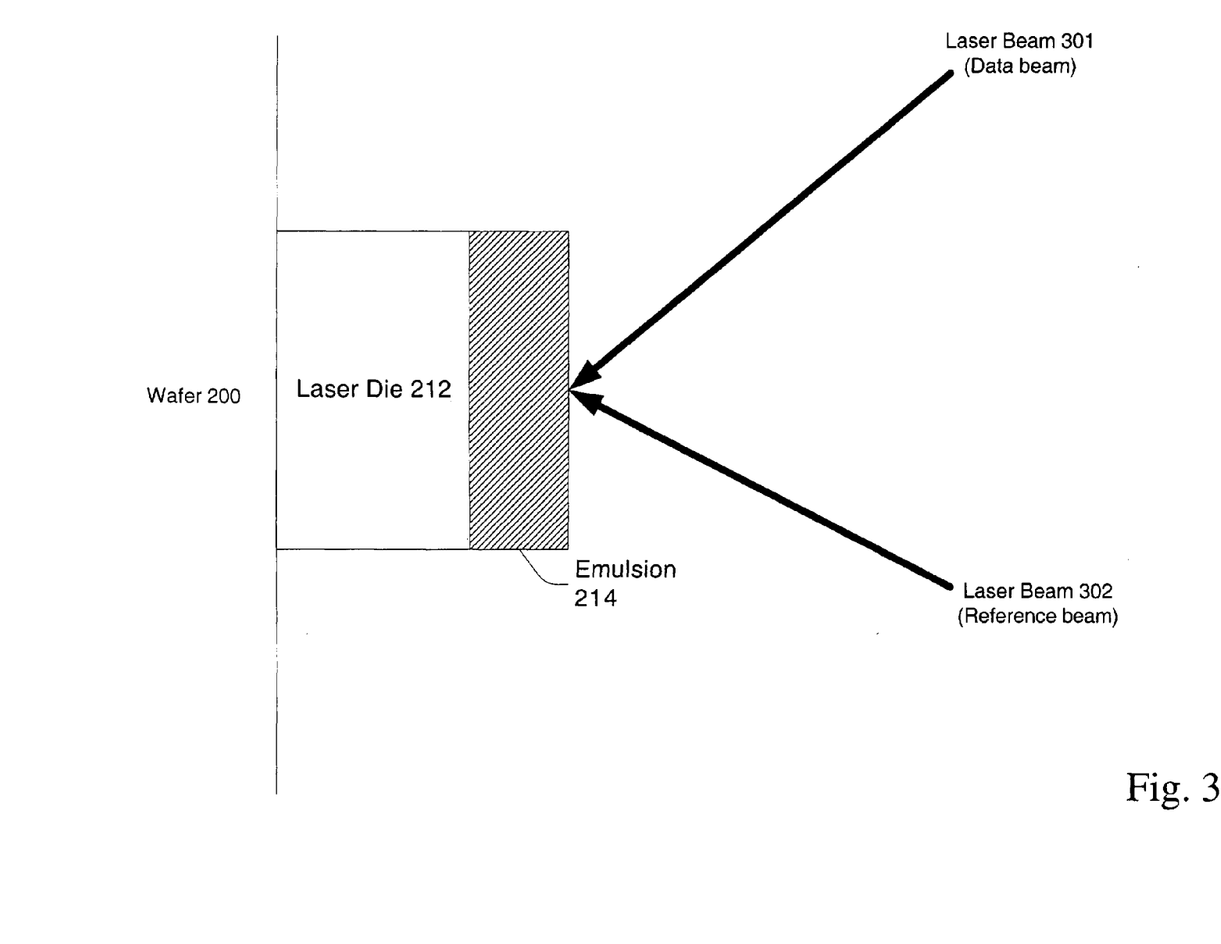
FIG. 3 depicts a side cross-sectional view of a portion of the wafer of FIG. 2 undergoing a step of the hologram forming process according to an embodiment of the present invention.

FIGS. 2 and 3 illustrate an example process of forming a volume phase hologram in photo-sensitive emulsions. FIG. 2 depicts a top view of a wafer 200 of semiconductor laser diodes 212, and FIG. 3 depicts a cross-sectional view of a portion of the wafer 200. As shown in FIG. 3, a layer of photo-sensitive emulsion 214 is disposed and patterned on the semiconductor laser die 212. Also shown in FIG. 3 are two light beams 301 and 302. The first light beam 301 and the second light beam 302 form an interference pattern in the emulsion layer 214. The first light beam 301 is preferably a "data beam" that contains information about the aberations in the system to be compensated. The second light beam 302 is preferably a reference beam that interferes with the data beam to form a holographic image in the emulsion layer 214. After the interference pattern is formed, hologram developing processes are applied to the emulsion layer 214. Thereafter, individual semiconductor laser dies can be separated.

Figure 4:
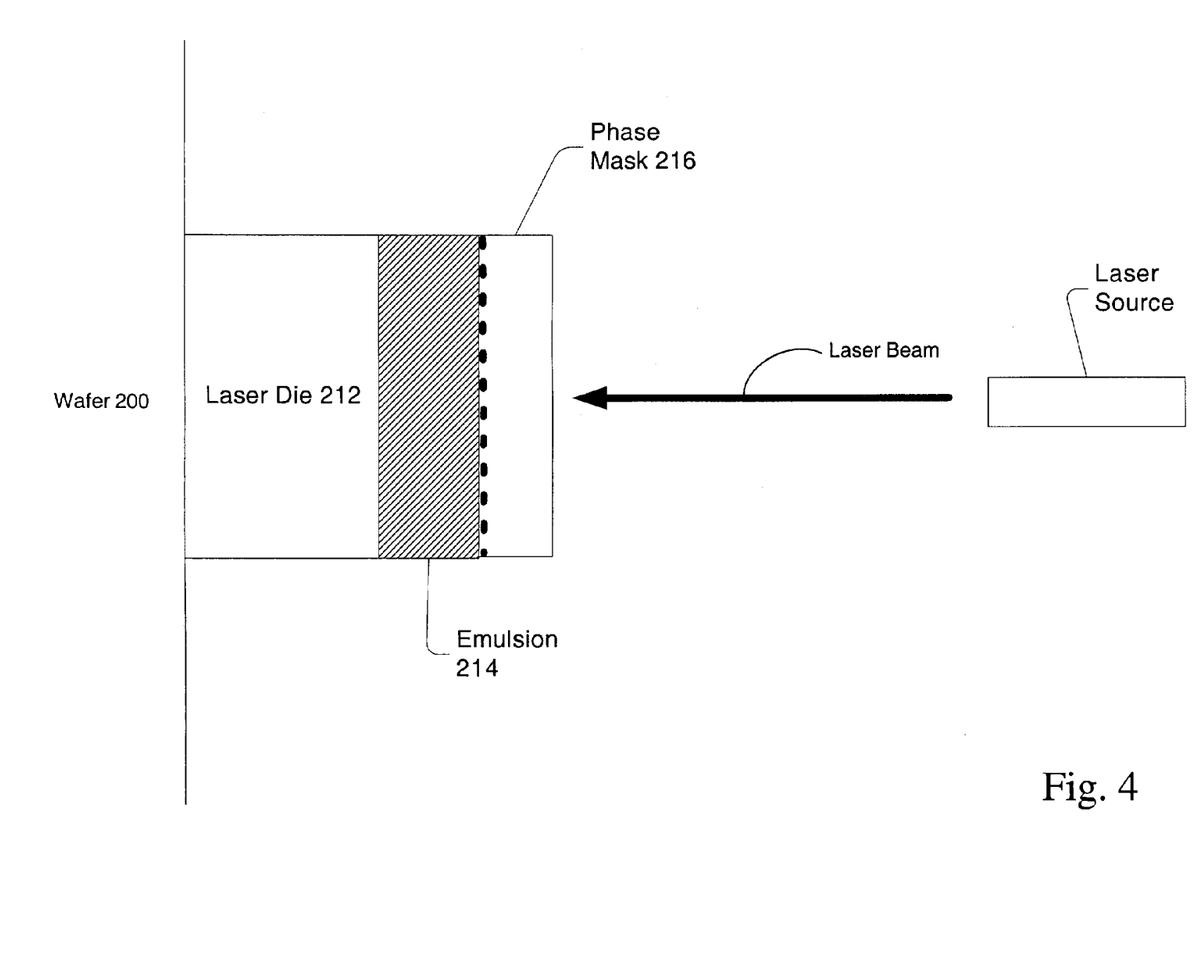
FIG. 4 illustrates a process of forming a volume phase hologram according to another embodiment of the present invention.

FIG. 4 illustrates a process of forming a volume phase hologram according to another embodiment of the present invention. In this embodiment, a phase mask 216 is disposed and patterned on the emulsion layer 214. The phase mask has regions of differing indexes of refraction. The phase mask 216 diffracts an incoming light beam 303 into +1 and −1 orders. The +1 and −1 orders form an interference pattern in the emulsion 214. The interference pattern thus formed is sometimes known as Bragg Gratings.

Figure 6:
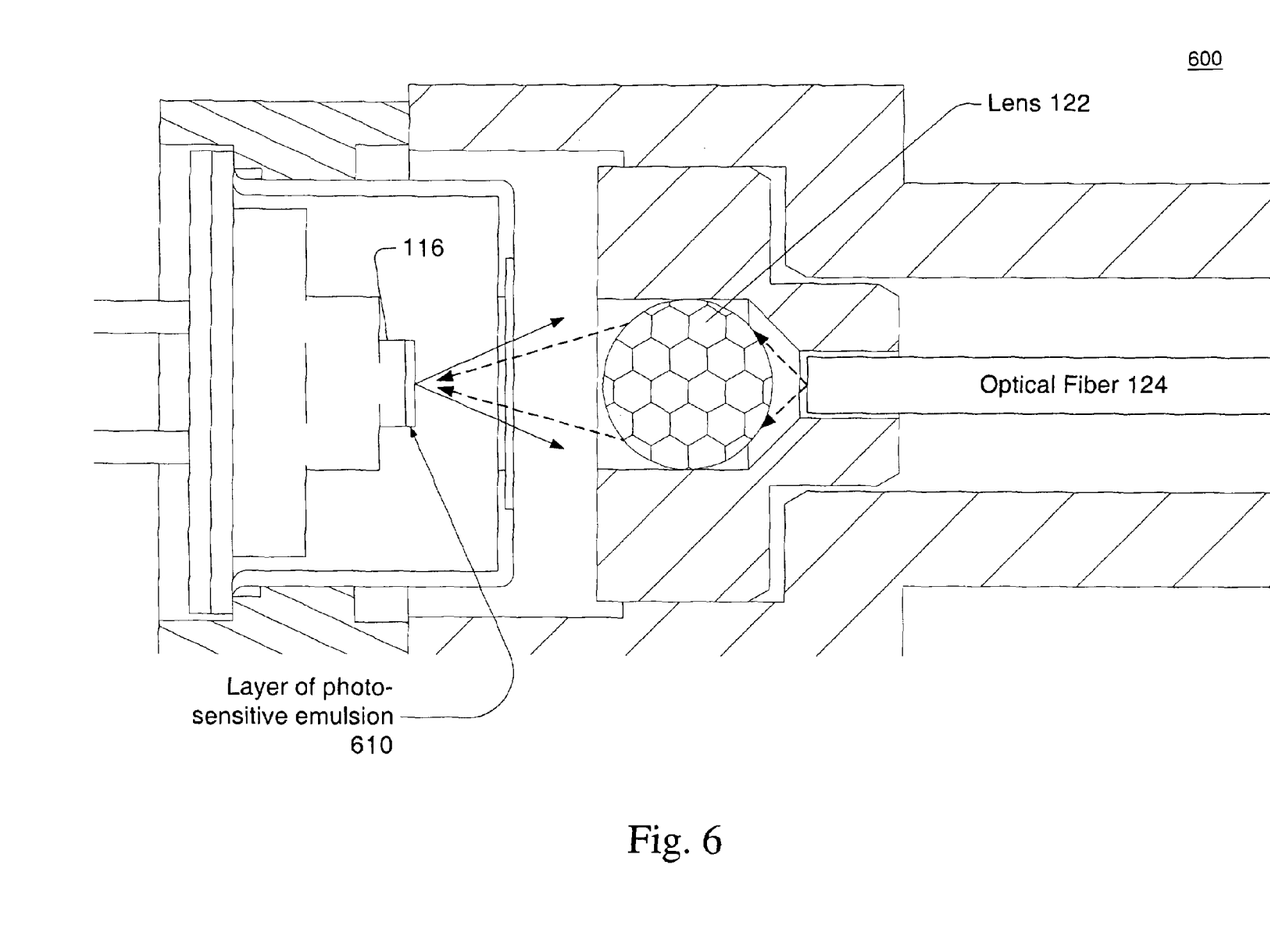
FIG. 6 illustrates a process of forming volume phase holograms according to yet another embodiment of the present invention.

According to another embodiment of the present invention, volume phase holograms are formed in situ in a TOSA. In this embodiment, which is shown in FIG. 6, a volume phase hologram is formed in a TOSA 600 by exposing the emulsion to an emitted light beam and a second light beam that is sent through the optical fiber 124. The emitted light beam and the second light beam form interference patterns in the emulsion layer 610. Once the interference patterns are formed, the TOSA 600 may be dissembled and then reassembled such that hologram-developing processes can be applied. The light beam that is sent through the optical fiber 124, can be a reflected version of the light beam emitted by the laser (e.g., by transmitting light from the emitted light beam down the optical fiber to a reflector and then back through the optical fiber and through the end of the optical fiber facing the laser diode).

Note that, in FIG. 6, a lens 122 is disposed between the semiconductor laser 116 and the optical fiber 124 when the hologram is formed. The volume phase hologram acts as a corrector for the lens 122 and compensates for or reduces the aberration of the lens 122. In other embodiments the volume phase holographic element is formed in situ in the TOSA without the lens 122.

Figure 7:
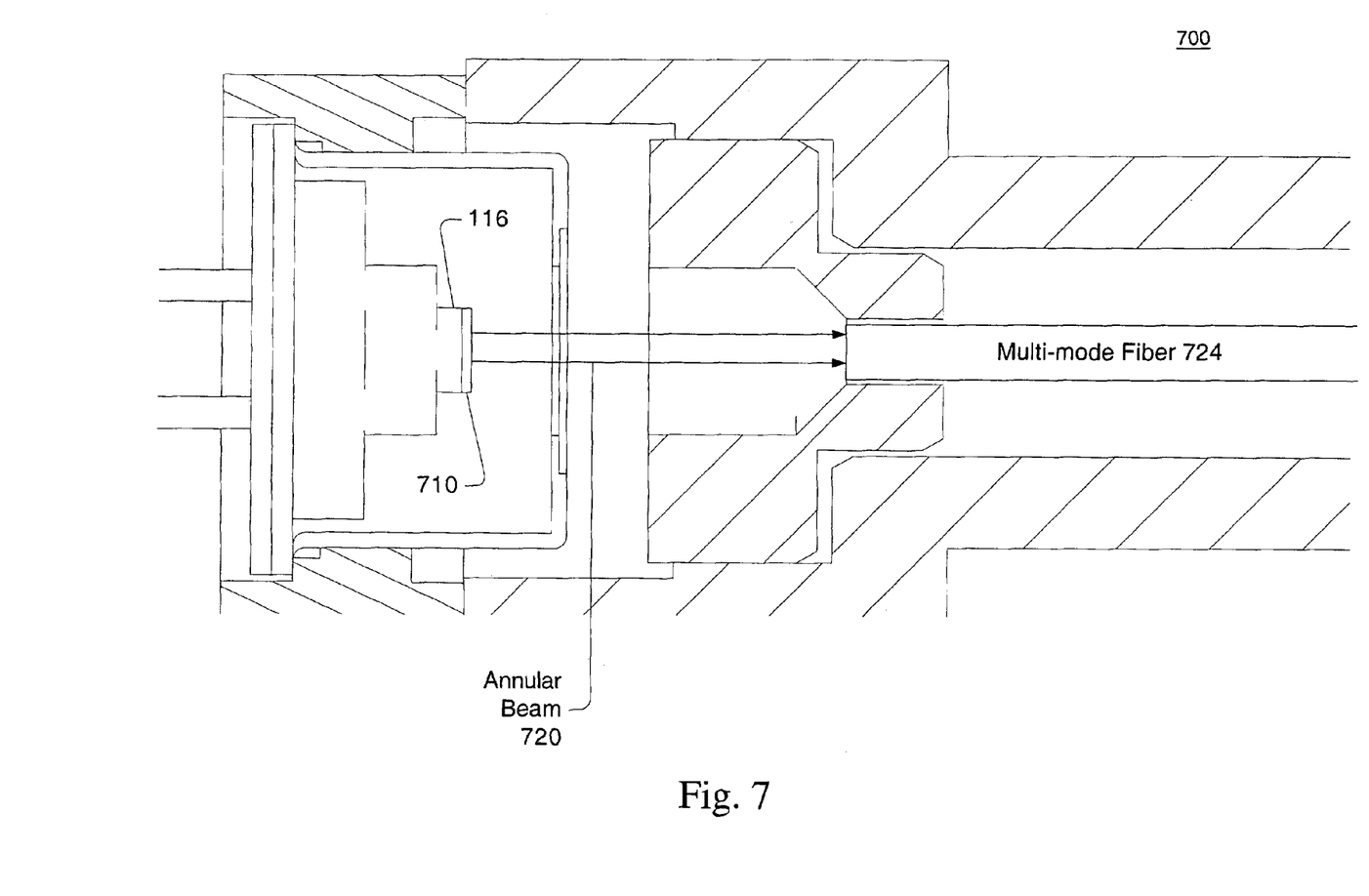
FIG. 7 depicts a cross-sectional view of a TOSA according to yet another embodiment of the present invention.

FIG. 7 depicts a cross-sectional view of a TOSA 700 according to yet another embodiment of the present invention. The laser diode 116 emits a light beam that has a substantially Gaussian intensity distribution, sometimes called a Gaussian profile. As shown, the volume phase holographic element 710 converts the Gaussian light beam emitted by laser diode 116 into an annular beam 720. The annular beam 720 is particularly suitable for a multimode fiber 724 because this class of beams suffers less intermodal dispersion than beams that have a Gaussian profile. As a result, longer lengths of multimode fiber can be used. Volume phase holographic elements that can produce annular beams from Gaussian beams are produced with processes similar to those described above.

While the present invention has been described with reference to a few specific embodiments, the description is illustrative of the invention and is not to be construed as limiting the invention. Various modifications may occur to those skilled in the art having the benefit of this disclosure without departing from the inventive concepts described herein.

What is claimed is:
1. A transmitter optical sub-assembly, comprising:
a semiconductor laser;
an optical fiber;
a lens disposed between the semiconductor laser and the optical fiber and configured to optically couple the semiconductor laser to the optical fiber, the lens having an aberration; and a volume phase holographic element disposed on a light emitting surface of the semiconductor laser, the volume phase holographic element including:
- a photo-sensitive emulsion layer that includes an interference pattern, the interference pattern being formed by an interaction between:
  - an emitted beam from the semiconductor laser; and
  - a second beam received through the lens; and
- wherein the interference pattern is configured to limit a vertex angle of light emitted by the semiconductor laser to at least partially correct for the aberration of the lens.

2. The transmitter optical subassembly of claim 1, wherein the volume phase holographic element has a volume phase hologram formed therein.

3. The transmitter optical subassembly of claim 2, wherein the semiconductor laser comprises a vertical cavity surface emitting laser.

4. The transmitter optical sub-assembly of claim 1, wherein the semiconductor laser comprises a vertical cavity surface emitting laser.

5. The semiconductor laser of claim 1, wherein the laser is optically aligned with the lens having aberration.

6. The semiconductor laser of claim 1, wherein the lens is further optically aligned with the optical fiber.

7. The transmitter optical subassembly of claim 1, wherein the semiconductor laser comprises an edge emitting semiconductor laser.

8. The transmitter optical subassembly of claim 1, the optical fiber receptacle structure having a fiber aligning sleeve and a fiber stop for receiving and optically aligning the optical fiber with the semiconductor laser and the lens.

9. A transmitter optical subassembly, comprising:
- a diode mount structure;
- an optical fiber receptacle structure;
- a transistor outline laser package mounted on the diode mount structure, the transistor outline package including a semiconductor laser that emits a Gaussian light beam;
- a window aligned between the semiconductor laser and the optical fiber receptacle structure; and
- a volume phase holographic element disposed on the semiconductor laser, the volume phase holographic element including:
  - a photo-sensitive emulsion layer that includes an interference pattern, wherein the interference pattern converts the Gaussian light beam to an annular beam.

10. The transmitter optical subassembly of claim 9, wherein the semiconductor laser is an edge emitting semiconductor laser.

11. The transmitter optical subassembly of claim 9, wherein the semiconductor laser comprises a vertical cavity surface emitting laser.

12. The transmitter optical subassembly of claim 9, further comprising an aberrated lens disposed in the window between the semiconductor laser and the optical fiber receptacle structure, said lens being optically aligned with the semiconductor laser.

13. The transmitter optical subassembly of claim 9, wherein the optical fiber receptacle structure includes a fiber aligning sleeve and a fiber stop for receiving and aligning an optical fiber with the laser package.

14. The transmitter optical subassembly of claim 9, wherein an optical fiber is disposed in the optical fiber receptacle structure.

* * * * *